United States Patent [19]

Yasuzato et al.

[11] Patent Number: 5,532,497
[45] Date of Patent: Jul. 2, 1996

[54] OPTICAL ALIGNER EQUIPPED WITH LUMINANCE SENSOR ON MOVABLE STAGE

[75] Inventors: Tadao Yasuzato; Hiroshi Nozue; Seiichi Shiraki, all of Tokyo, Japan

[73] Assignee: NEC Corporation, Tokyo, Japan

[21] Appl. No.: 360,115

[22] Filed: Dec. 20, 1994

[30] Foreign Application Priority Data

Dec. 27, 1993  [JP]  Japan .................... 5-350112

[51] Int. Cl.⁶ .............................. G01N 21/86; G01V 9/04
[52] U.S. Cl. ........................................... 250/548; 356/400
[58] Field of Search ................ 355/67, 71; 250/548, 250/201.1, 206.1, 206.2; 356/399, 400, 401, 141.5, 121, 122, 222, 152.1

[56] References Cited

U.S. PATENT DOCUMENTS

| | | | |
|---|---|---|---|
| 4,929,824 | 5/1990 | Miyazaki | 356/222 |
| 4,937,611 | 6/1990 | Miyazaki | 356/222 |
| 5,146,258 | 9/1992 | Bell et al. | 356/222 |
| 5,184,172 | 2/1993 | Miyazaki | 356/222 |
| 5,251,067 | 10/1993 | Kamon | 355/67 |
| 5,264,898 | 11/1993 | Kamon et al. | 355/67 |
| 5,335,044 | 8/1994 | Shiraishi | 355/67 |
| 5,379,090 | 1/1995 | Shiraishi | 355/67 |
| 5,420,417 | 5/1995 | Shiraishi | 356/121 |
| 5,436,692 | 7/1995 | Noguchi | 355/71 |

FOREIGN PATENT DOCUMENTS 61-91662  5/1986  Japan .
63-70419  3/1988  Japan .

Primary Examiner—Georgia Y. Epps
Assistant Examiner—Jacqueline M. Steady
Attorney, Agent, or Firm—Young & Thompson

[57] ABSTRACT

A projection aligner transfers a pattern image of a reticle by using a light radiated from a light source through a diaphragm to a photo-resist layer, and the position of the light source is automatically regulated on the basis of pieces of illuminance data simultaneously measured on an image forming plane so that the regulation is exact and completed within a short time period.

8 Claims, 8 Drawing Sheets

OPTICAL ALIGNER EQUIPPED WITH LUMINANCE SENSOR ON MOVABLE STAGE

BACKGROUND OF THE INVENTION

1. Field of the Invention

This invention relates to an optical aligner and, more particularly, to an optical sensor equipped with a luminance sensor.

2. Description of the Related Art

In a fabrication process of semiconductor integrated circuit device, various patterns are transferred onto a semiconductor wafer through lithographic techniques, and an optical reduction projection aligner usually transfers the patterns from masks to the semiconductor wafer. The optical reduction projection aligner presently available can transfer 0.5 micron line width for commercial products through an enlargement of numerical aperture of the projection optics. Although the enlargement of numerical aperture enhances the resolution, the depth of focus is decreased, and the trade-off between the resolution and the depth of focus does not allow the optical reduction projection aligner to transfer a line width equal to or less than 0.35 micron at an acceptable throughput for commercial products.

An attractive illumination system is disclosed in Japanese Patent Publication of Unexamined Application No. 61-91662, and FIG. 1 illustrates the prior art projection aligner disclosed in the Japanese Patent Publication of the Unexamined Application. The prior art projection aligner comprises a light source 1, elliptical mirrors 2a and 2b, a cold mirror 3 and a shutter 4. The light source 1 is implemented by a ultra high-pressure mercury lamp, and generates continuous spectrum light. The elliptical mirrors 2a and 2b condense and reflect the light toward the cold mirror 3, and the cold mirror 3 eliminates long-wavelength light from the light. The cold mirror 3 reflects ultra violet and visible light toward the shutter 4. In this instance, the g-line at 436 nanometer wavelength or the i-line at 365 nanometer wavelength is used in the pattern transfer, and these rays are majority in the reflected visible light. The shutter 4 selectively transmits and cuts off the reflected visible light.

The prior art projection aligner further comprises a lens 5 and an interference filter 6. The lens 5 makes the reflected visible light parallel, and the interference filter 6 only transmits the reflected visible or ultra violet light with the wavelength at 436 nanometers or 365 nanometers plus minus several nanometers.

The prior art projection aligner further comprises a fly-eye lens 8 implemented by elongated rectangular single lens units bundled together, and each single lens unit focuses for forming a light source group. The ultra high-pressure mercury lamp 1 radiates light which is not so coherent. The light passing through the fly-eye lens 7 makes a point source, and is enhanced in coherence. The point sources are called "effective light sources".

The prior art projection aligner further comprises a diaphragm 8 for shaping the light from the effective light source 7, a masking system 9, lens units 10 and 11 provided on both sides of the masking system 9, a mirror 12 for reflecting the light toward a reticle 13, a lens unit 14 provided between the mirror 12 and the reticle 13 and a projection lens system 15. The lens 10 focuses the light passing through the diaphragm 8 on the masking system 9, because the light focused on the masking system 9 restricts the diffraction due to the edge of the masking blade of the system 9.

The masking system 9 limits the exposure area, and the lens unit 11 and the mirror 12 change the optical path, and the change of the optical path makes the prior art projection aligner small. The reticle 13 is uniformly illuminated by virtue of the fly-eye lens 7, and the light transfers the pattern image through the projection lens system 15 to a photo-sensitive layer 16 coating a semiconductor wafer 17 mounted on an x-y stage 18. The photo-sensitive layer 16 is partially polymerized or depolymerized by the image-carrying light, and is, thereafter, developed for providing a mask layer on the semiconductor wafer 17.

Subsequently, description is made on an influence of the diaphragm 8 after the fly-eye lens 7 with reference to FIGS. 2A to 2D of the drawings. As shown in FIG. 2A, the diaphragm 8' usually has a circular opening 8a, and determines the numerical aperture NA of the projection optics. The numerical aperture NA of the projection optics affects the resolution characteristics, and sigma is defined as a ratio between NA of the illumination system and NA of the projection lens system 15. Sigma indicates the magnitude of the effective light source, and sigma is selected between 0.3 to 0.7 depending upon the image pattern of the reticle 13. For example, a line-and-space pattern formed in the reticle 13 requires relatively large sigma, and relatively small sigma is appropriate for an image pattern for a contact hole.

Moreover, the shape of the effective light source is optimized. For example, a diaphragm 8" may have a central shield area 8b so as to form a ring-shaped effective light source as shown in FIG. 2B. In general, 0-order light and either +1 or −1 order light are available for the resolution of the image pattern in the reticle 8. However, if the image pattern is miniaturized, the diffraction angle becomes large, and the light is hardly incident into the projection lens system 15. For this reason, the diaphragm 8' with the circular opening 8a allows only 0-order light L0 to pass through a central area thereof, and only the 0-order light L0 is incident into the projection lens system 15. The 0-order light L0 decreases the contrast, and the pattern image is hardly transferred to the photo-sensitive layer 16 due to the poor contrast.

However, if the diaphragm 8" with the ring-shaped opening 8c is used for the pattern transfer as shown in FIG. 2D, only oblique light L1 is incident into the reticle 13, and either +1 or −1 order light passes through the projection lens system 15 to the photo sensitive layer 16. As a result, the miniature pattern is transferred to the photo-sensitive layer 16. Thus, the ring-shaped illumination effectively transfers a miniature pattern.

In order to improve the resolution by using the oblique light L1 as similar to the ring-shaped illumination, a diaphragm has four small openings, and illuminates a reticle through the four openings. However, the pattern transfer characteristics of the diaphragm is varied depending upon the shield area, and reticles with different image patterns require different diaphragms. Illumination systems using those diaphragms are called as an oblique illuminations or modified illuminations because of the light sources variable in shape.

However, the modified illumination system partially masks the parallel rays supplied from a fly-eye lens, and deteriorates the uniformity in illuminance. Moreover, the dispersion of the illuminance is varied with the shape of the opening in the diaphragm. For this reason, whenever an operator changes a diaphragm to another diaphragm different in shape of the opening, the operator measures the dispersion of the illuminance, and an adjusting work is required.

The measurement of the illuminance and the adjusting work are described hereinbelow. Turning to FIG. 1 of the drawings, photo-sensors 19 are put on the x-y stage. The operator moves the x-y stage 18 at short intervals in the x and y directions, and the shutter 4 are released in synchronism with the movement of the photo-sensors 19. The illuminance thus measured is recorded, and the x-y stage 18 causes the photo-sensors 19 to measure the illuminance over the exposure area. If the exposure area is not uniformly illuminated, the operator manipulates a regulating mechanism 19a for the ultra high-pressure mercury lamp 1, and regulates the position of the ultra high-pressure mercury lamp 1. The regulating mechanism 19a moves the ultra high-pressure mercury lamp 1 in the orthogonal coordinates x-y-z. The regulation of the ultra high-pressure mercury lamp 1 depends upon the experience of the operator, and, for this reason, the measurement of the illumination and the regulation are alternately carried out until the uniformity of illuminance satisfies a specification.

The trial-and-error regulation for uniform illumination is replaced with an automatic regulation. Japanese Patent Publication of Unexamined Application No. 63-70419 discloses the automatically regulable projection aligner, and FIG. 3 illustrates the automatically regulable projection aligner. Main component parts of the automatically regulable projection aligner are similar to those of the prior art projection aligner shown in FIG. 1, and are labeled with the same references. Differences are photo-sensors 20a, 20b, 20c and 20d provided on the masking system 9, a computer 21 and a driving system 22 for actuating the regulating mechanism 19.

As will be better seen in FIG. 4, the masking system 11a places the four photo-sensors 20a, 20b, 20c and 20d in a peripheral sub-area of the exposure area 23, and each of the photo-sensors 20a to 20d reports the illuminance to the computer 21. The computer 21 checks the reported illuminances to see whether to regulate the position of the ultra high-pressure mercury lamp 1 or not. If the regulation is necessary, the computer 21 instructs the driving system to actuate the regulating mechanism 19, and regulates the illuminances at the photo-sensors 20a to 20d to an acceptable range.

However, there is a trade-off in the prior art projection aligners between the accuracy of the regulation and the time consumed in the regulation. Namely, the operator manually moves the x-y stage over the exposure area for measuring the illuminance, and manually regulates the position of the ultra high-pressure mercury lamp. For this reason, the dispersion of illuminance over the exposure area exactly falls within an expected value defined in the specification. However, the trial-and-error regulation is time consuming. On the other hand, the prior art projection aligner shown in FIG. 3 quickly regulates the position of the ultra high-pressure mercury lamp 1 by virtue of the computer unit 21 communicating with the photo-sensors 20a to 20d. However, the photo-sensors 20a to 20d only monitor the fixed four points in the exposure area 23, and the accuracy is lower than that of the manually regulated projection aligner.

The pattern image of the reticle is progressively miniaturized, and the modified illumination or the oblique illumination using the non-circular opening is indispensable for transferring the miniature pattern image. For this reason, the semiconductor manufacturer needs a solution for the trade-off.

SUMMARY OF THE INVENTION

It is therefore an important object of the present invention to provide a projection aligner which quickly makes an exposure area exactly uniform.

To accomplish the object, the present invention proposes to measure luminance on a movable stage.

In accordance with the present invention, there is provided a projection aligner for transferring a pattern image of a reticle to an image forming plane,, comprising: an illuminating system for radiating a light from a light source to the reticle so that the reticle transfers the light carrying the pattern image to the photo-sensing layer; an illuminance measuring system having a plurality of sampling points on the image forming plane for concurrently generating pieces of illuminance data each indicative of an illuminance of one of the sampling points; and a regulating system responsive to the pieces of illuminance data for changing a position of the light source, thereby causing values of the pieces of illuminance data to fall within an admitted range.

BRIEF DESCRIPTION OF THE DRAWINGS

The features and advantages of the projection aligner according to the present invention will be more clearly understood from the following description taken in conjunction with the accompanying drawings in which.

DESCRIPTION OF THE PREFERRED EMBODIMENTS

First Embodiment

Figure 1:
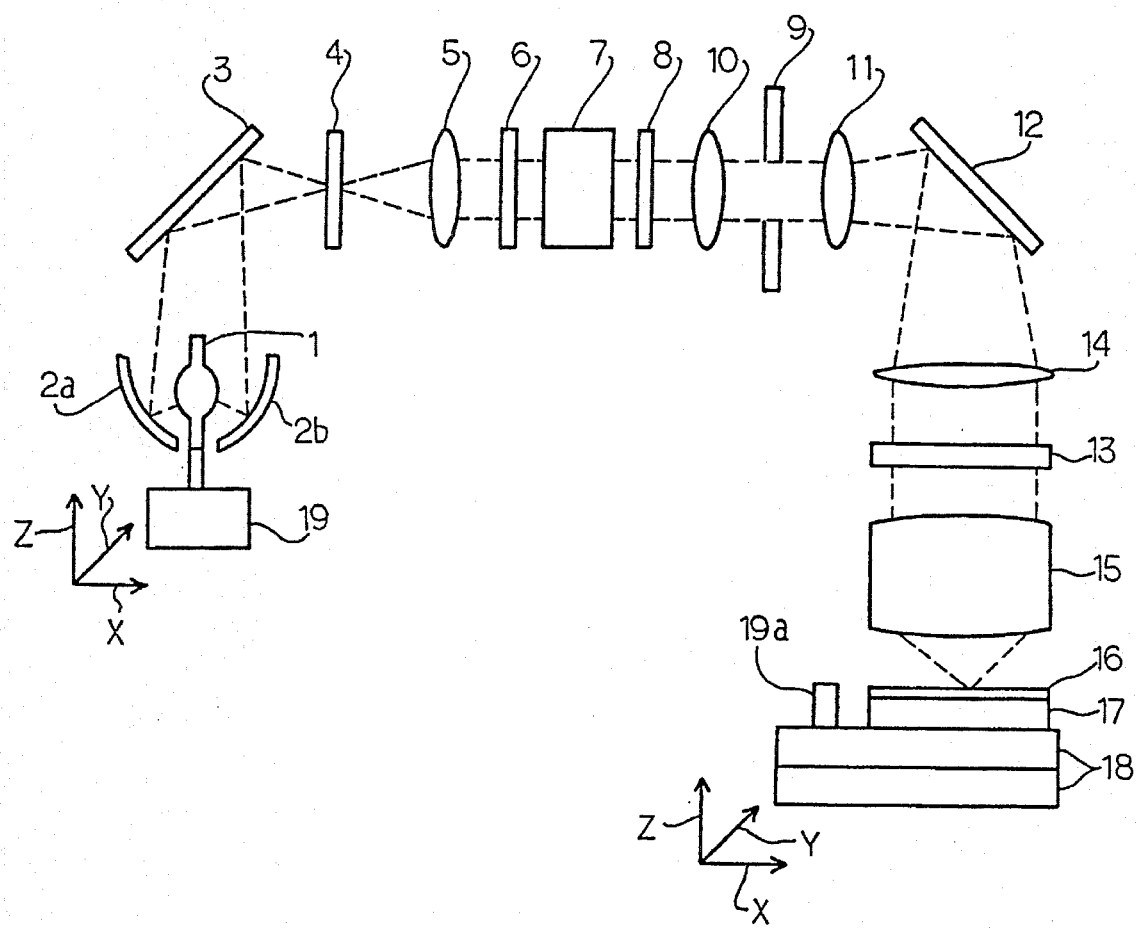
FIG. 1 is a schematic view showing the prior art projection aligner.
Figure 2A:
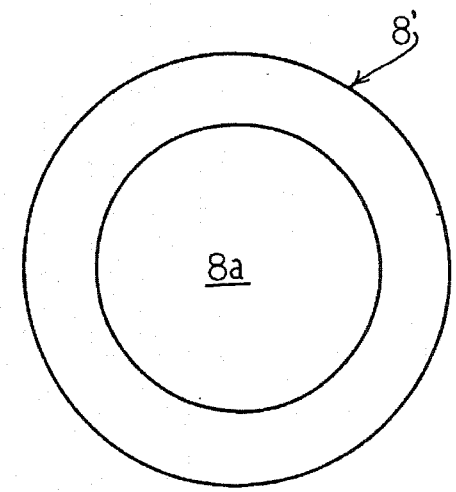
FIG. 2A is a front view showing the diaphragm incorporated in the prior art projection aligner.
Figure 2B:
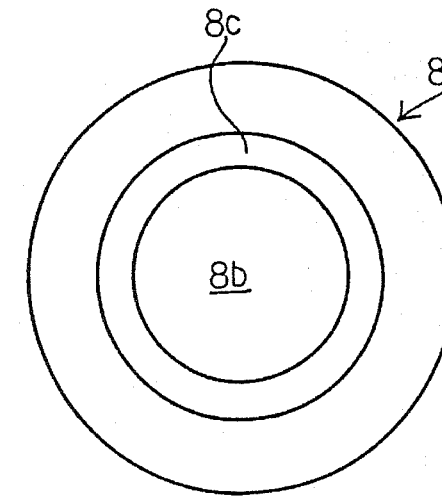
FIG. 2B is a partially cross sectional view showing the illumination using the diaphragm shown in FIG. 2A.
Figure 2C:
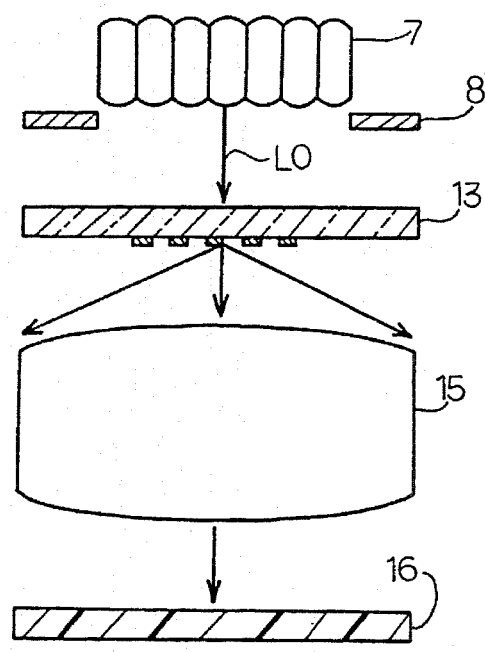
FIG. 2C is a front view showing another diaphragm used in the prior art projection aligner.
Figure 2D:
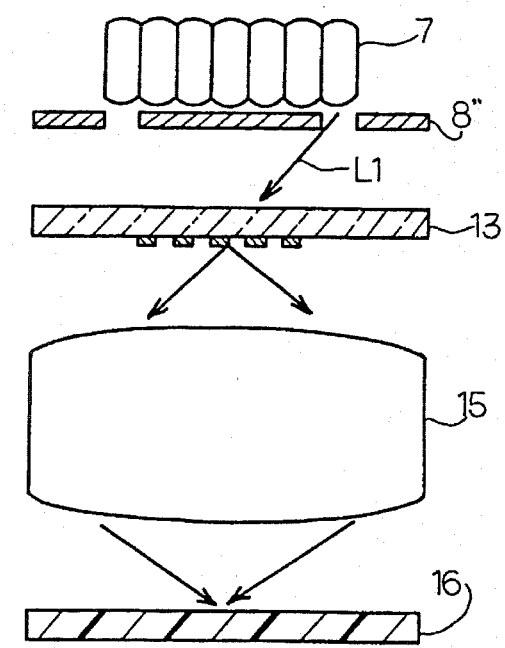
FIG. 2D is a partially cross sectional view showing the illumination using the diaphragm shown in FIG. 2C.
Figure 3:
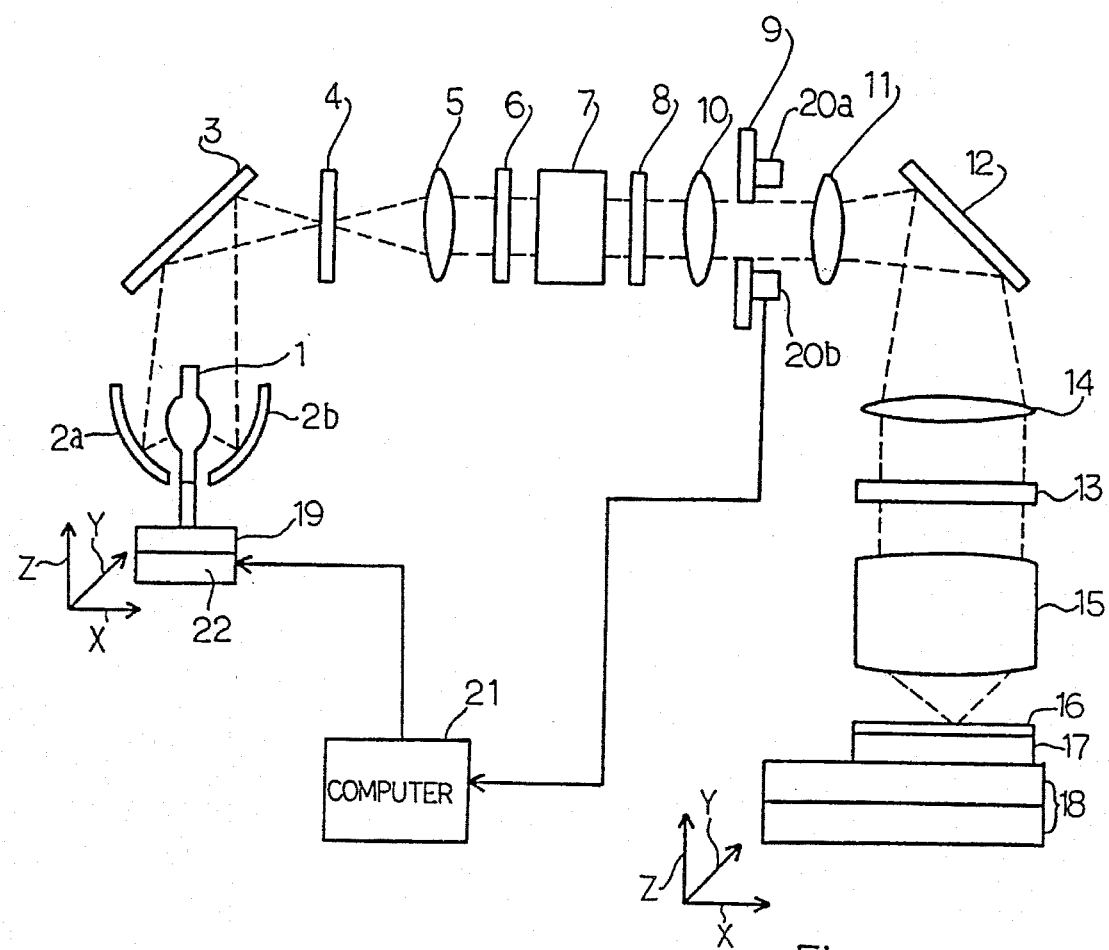
FIG. 3 is a schematic view showing the prior art projection aligner automatically regulating the position of the light source.
Figure 4:
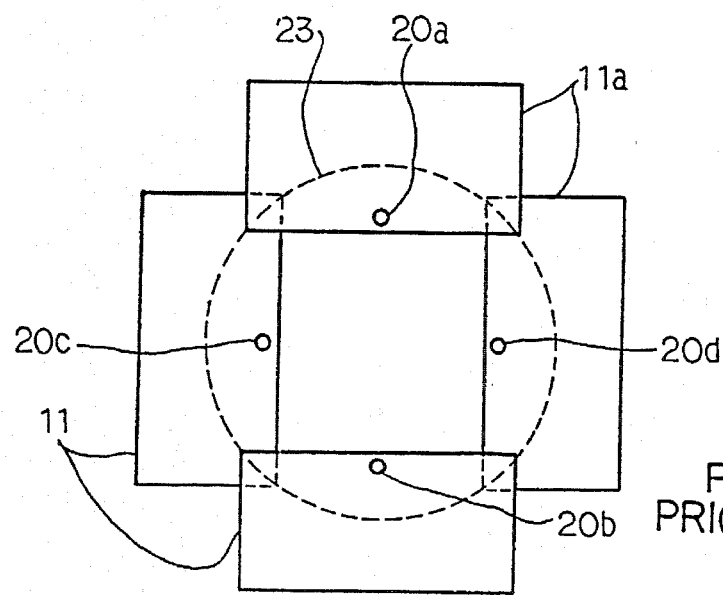
FIG. 4 is a front view showing the photo-sensors associated with the diaphragm incorporated in the prior art projection aligner.
Figure 5:
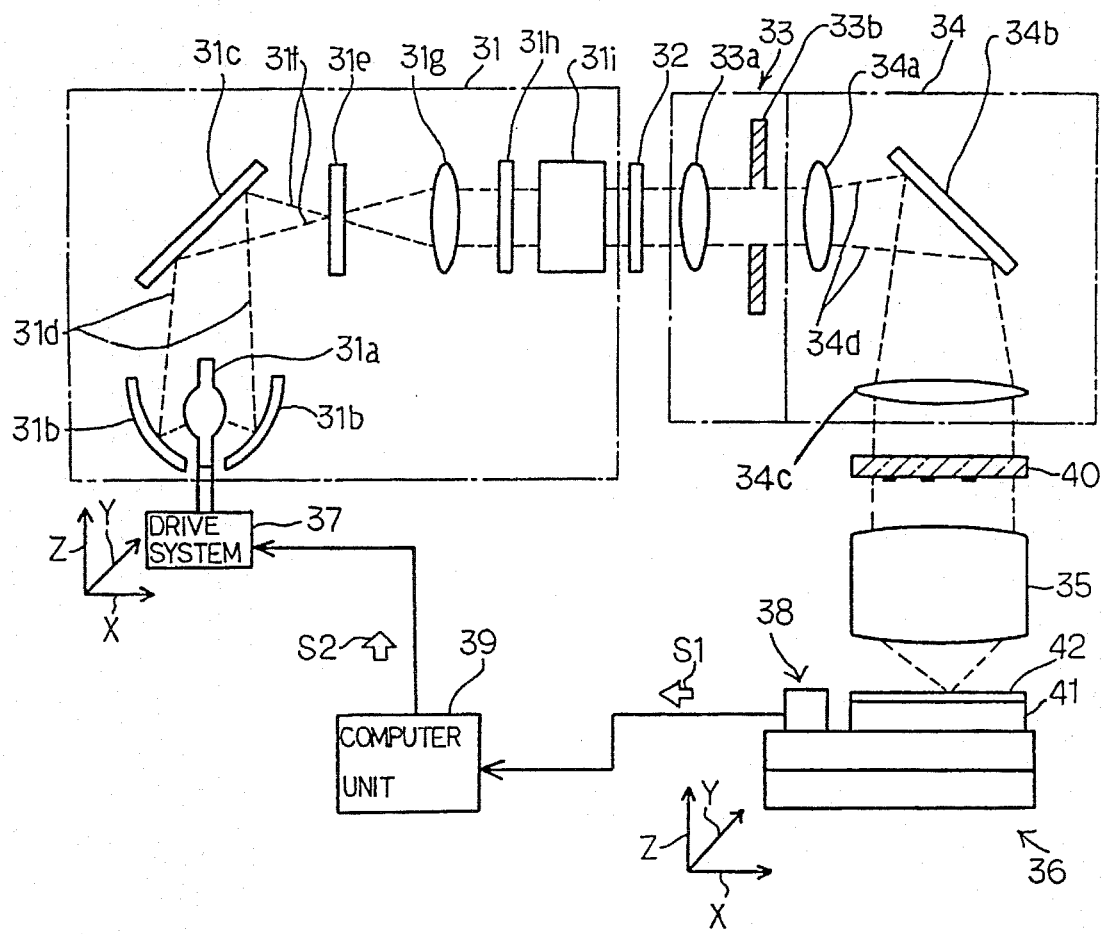
FIG. 5 is a schematic view showing a projection aligner according to the present invention.

Referring to FIG. 5 of the drawings, a projection aligner embodying the present invention largely comprises a coherent light generating system 31, a diaphragm 32, a masking system 33, an optical radiation guide system 34, a projection lens system 35, a movable stage 36, a driving system 37, a photo-sensing system 38 and a computer unit 39. A reticle 40 is provided between the optical radiation guide system 34 and the projection lens system 35, and a semiconductor wafer 41 coated with a photo-resist layer 42 is mounted on the movable stage 36.

The coherent light generating system 31 comprises an ultra high-pressure mercury lamp unit 31a supported by the driving mechanism 37, elliptical mirrors 31b provided around the ultra high-pressure mercury lamp 31a and a cold mirror 31c provided in an optical path 31d reflected on the elliptical mirrors 31b.

The ultra high-pressure mercury lamp 31a generates continuous spectrum light. In other words, the light generated by the ultra high-pressure mercury lamp 31a is not coherent. The elliptical mirrors 31b condense the light, and reflects the light along the optical path toward the cold mirror 31c. The cold mirror 31c eliminates long-wavelength light components from the light generated by the ultra high-pressure mercury lamp 31a, and reflects visible light components along an optical path 31f.

The coherent light generating system 31 further comprises a shutter member 31e provided on the optical path, a lens unit 31g provided on the opposite side of the shutter member 31e to the cold mirror 31c, an interference filter unit 31h and a fly-eye lens unit 31i. The shutter member 31e is located at a constricted point on the optical path 31f, and transmits or cuts off the visible light along the optical path 31f.

The lens unit 31g makes the visible light parallel, and the interference filter 6 only transmits visible light components used in a pattern transfer. For this reason, the visible light components with target wavelength and plus minus several nanometers are incident into the fly-eye lens unit 31i. The fly-eye lens unit 31i enhances the coherency of the visible light components, and serves as an effective light source for coherent light.

The diaphragm 32 shapes the bundle of rays of coherent light, and is the modified illumination or the oblique illumination. Therefore, the diaphragm 32 is replaced with another diaphragm depending upon a pattern image formed on the reticle 40, and causes the coherent light to carry a miniature pattern.

The masking system 33 has a lens unit 33a and a masking blade unit 33b. The lens unit 33a focuses the coherent light on the masking blade unit 33b, and restricts the diffraction due to the edges of the masking blade unit 33b.

The masking blade unit 33b defines an exposure area, and the coherent light is transferred through the masking blade unit 33b to the optical path guide system 34.

The optical path guide system 34 comprises a lens unit 34a, a mirror 34b and a lens unit 34c. The lens unit 34a allows the coherent light to fall on the mirror 34b, and the mirror 34b changes the optical path 34d by a certain number of degrees. The coherent light reflected on the mirror 34b is incident into the lens unit 34c, and is transferred to the reticle 40. Since the optical path 34d is bent, the lateral distance of the projection aligner is decreased. However, if a projection aligner allows the optical path 34d to extend straightly, the optical path guide system may not be deleted from the projection aligner.

The reticle 40 is uniformly illuminated by virtue of the fly-eye lens unit 31i, and the coherent light transfers the pattern image through the projection lens system 35 to the photo-resist layer 42. The photo-resist layer 42 is partially polymerized or depolymerized by the image-carrying light, and is, thereafter, developed for providing a mask layer on the semiconductor wafer 41.

Figure 6:
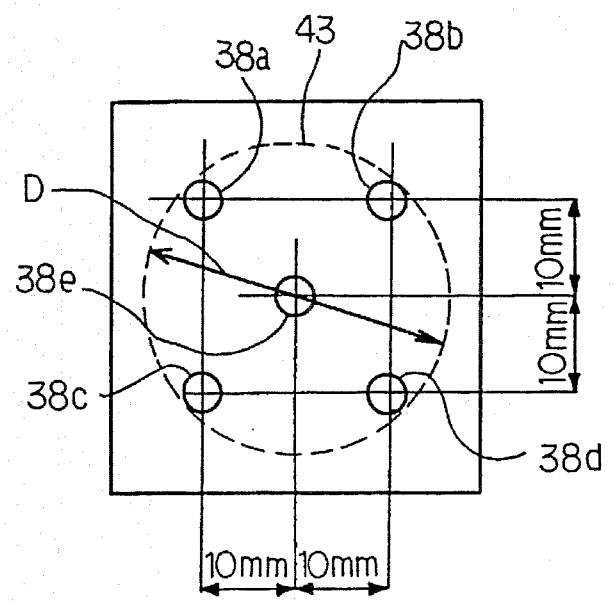
FIG. 6 is a plan view showing the arrangement of photo-sensors incorporated in the projection aligner.
Figure 7:
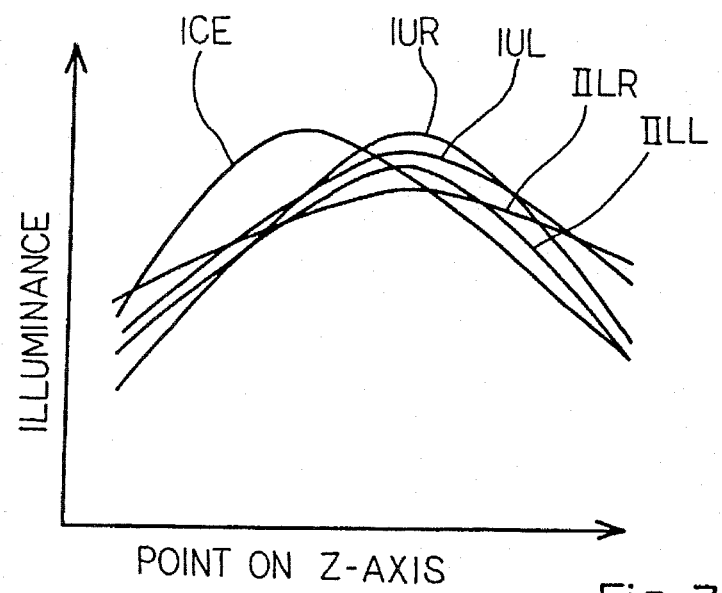
FIG. 7 is a graph showing variation in illuminance measured by photo-sensors when a light source is moved along z-axis.

The movable stage 36 moves the semiconductor wafer 41 in x-direction and y-direction, and aligns the semiconductor wafer 41 with the exposure area of the coherent light. The photo-sensing system 38 has photo-sensors 38a, 38b, 38c, 38d and 38e (see FIG. 6) on the movable stage 36, and the photo-sensors 38a to 38e are as high as an image forming plane on the photo-resist layer 42. The photo-sensors 38a to 38d are arranged in an outer peripheral sub-area of the exposure area 43, and are angularly spaced apart at about 90 degrees. The photo-sensor 38e is provided at a center of the exposure area 43, and the exposure area 43 has a diameter D of 32 millimeter in this instance. The exposure area 43 is usually represented by a square, and the exposure area 43 may be defined by a square of 32 millimeters by 32 millimeters. Each of the photo-sensors 38a to 38e measures the luminance in the exposure area 43, and the photo-sensing system 38 generates photo-detecting signals S1 each indicative of the luminance.

The computer unit 39 has an input/output unit, a program memory, a working memory and a microprocessor, and the photo-detecting signals S1 are supplied to the input/output unit. The microprocessor sequentially fetches the photo-detecting signals S1 for storing luminance data in the working memory. The microprocessor calculates a deviation of the luminance, and determines whether the maximum deviation falls within an admitted range. If the maximum deviation is out of the admitted range, the microprocessor supplies a driving signal S2 through the input/output unit to the driving system 37.

The driving system 37 is responsive to the driving signal S2 for three-dimensionally moving the ultra high-pressure mercury lamp 31a, and the x-axis and the y-axis of the motion for the ultra high-pressure mercury lamp 31a are in parallel to the x-axis and the y-axis of the moving stage 36. The driving system 37 further moves the ultra high-pressure mercury lamp 31a in z-axis aligned with the optical path 31D.

When the reticle 40 is changed, the reticle 40 is moved out of the optical path, and the masking blade unit 33b is fully opened. Subsequently, the photo-sensing system 38 is moved to the exposure area 43 under the projection lens unit 35. The shutter member 31e is released, and the five photo-sensors 38a to 38e measure the luminance at the five points.

If the deviation does not fall within the allowed range, the computer unit 39 instructs the driving system 37 to regulate the position of the ultra high-pressure mercury lamp 31a. The driving system 37 firstly moves the ultra high-pressure mercury lamp 31a to maximize the illuminance through the diaphragm 32. A lower dead point and an upper dead point are provided for the ultra high pressure mercury lamp 31a, and the driving system 37 stepwise moves the ultra high-pressure mercury lamp 31a at intervals from the lower dead point toward the upper dead point. The illuminance is measured at every points, and the photo-sensing system 38 supplies the photo-detecting signals S1 indicative of the pieces of illuminance data to the computer unit 39. When the ultra high pressure mercury lamp 31a reaches the upper dead point, the pieces of illuminance data stored in the working memory form Plots ICE, IUR, IUL, IILR and IILL respectively indicative of variation in illuminance measured by the photo-sensor 38e, variation in illuminance measured by the photo-sensor 38b, variation in illuminance measured by the photo-sensor 38a, variation in illuminance measured by the photo-sensor 38*d* and variation in illuminance measured by the photo-sensor 38*c*. Then, the microprocessor calculates an average illuminance IAVE as follows.

$$IAVE=\{ICE+(IUR+IUL+IILR+IILL)/4\}/2 \qquad (1)$$

Figure 8:
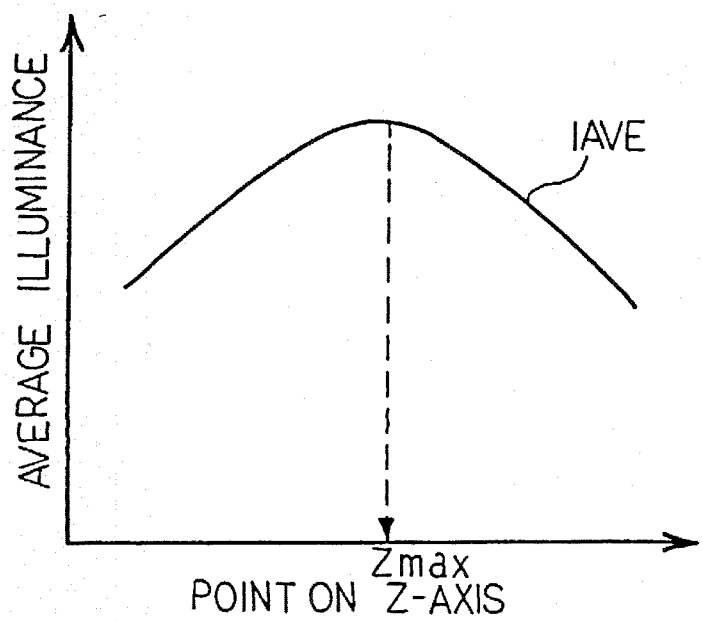
FIG. 8 is a graph showing variation in average illuminance along the z-axis.

The average illuminance is plotted as shown in FIG. 8, and the microprocessor instructs the driving system 37 to move the maximum point Zmax where the maximum average illuminance is obtained.

Figure 9:
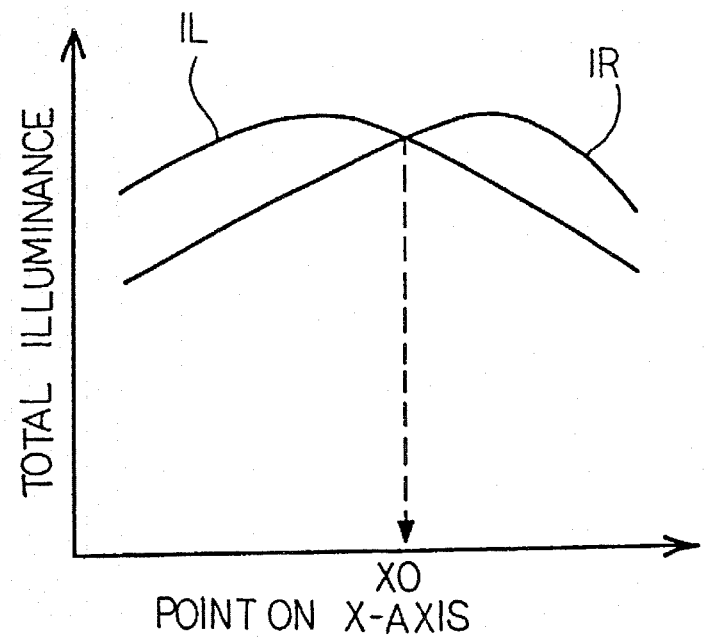
FIG. 9 is a graph showing a first total illuminance and a second total illuminance varied along an x-axis.

Subsequently, the microprocessor seeks a matching point on the x-axis. A left-side dead point and a right-side dead point are also provided for the ultra high-pressure mercury lamp 31*a*, and the driving system 37 stepwise moves the ultra high-pressure mercury lamp 31*a* from the left-side dead point toward the right-side dead point. The illuminance is measured at every point on the x-axis, and the photo-sensing system 38 supplies the photo-detecting signals S1 to the microprocessor. While the ultra high-pressure mercury lamp 31*a* is being moved along the x-axis, the driving system 37 does not move the ultra high-pressure mercury lamp 31*a* in the direction of z-axis and in the direction of y-axis. The microprocessor calculates the first total illuminance IL of the photo-sensors 38*a* and 38*c* and the second total illuminance IR of the photo-sensors 38*b* and 38*d*, and the first total illuminance IL and the second total illuminance IR are plotted as shown in FIG. 9. The microprocessor compares the first total illuminance IL with the second total illuminance IR at every point on the x-axis, and determines a matching point X0 where the first total illuminance IL is equal to the second total illuminance IR.

Figure 10:
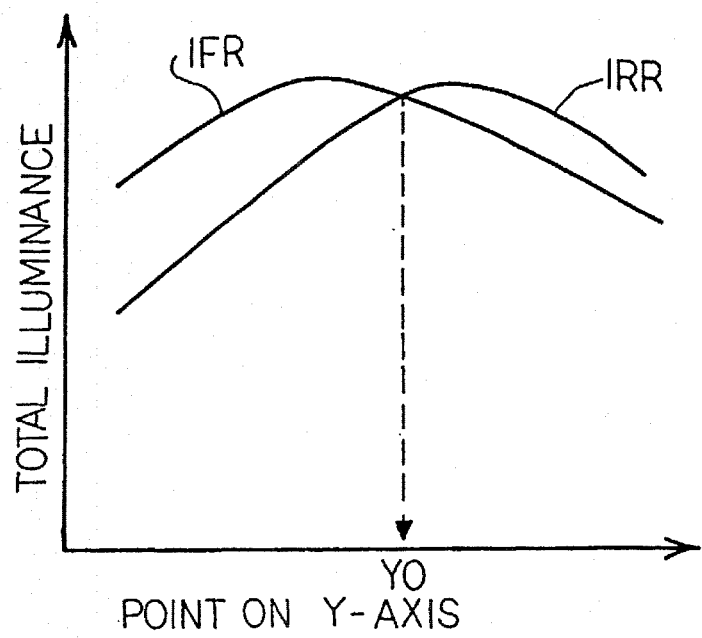
FIG. 10 is a graph showing a third total illuminance and a fourth total illuminance varied along a y-axis.

Subsequently, the microprocessor seeks a matching point on the y-axis. A front-side dead point and a rear-side dead point are also provided for the ultra high-pressure mercury lamp 31*a*, and the driving system 37 stepwise moves the ultra high-pressure mercury lamp 31*a* from the front-side dead point toward the rear-side dead point. The illuminance is measured at every point on the y-axis, and the photo-sensing system 38 supplies the photo-detecting signals S1 to the microprocessor. While the ultra high-pressure mercury lamp 31*a* is being moved along the y-axis, the driving system 37 does not change the ultra high-pressure mercury lamp 31*a* in the direction of z-axis and in the direction of x-axis. The microprocessor calculates the third total illuminance IFR of the photo-sensors 38*a* and 38*b* and the fourth total illuminance IRR of the photo-sensors 38*c* and 38*d*, and the third total illuminance IFR and the fourth total illuminance IRR are plotted as shown in FIG. 10. The microprocessor compares the third total illuminance IFR with the fourth total illuminance IRR at every point on the y-axis, and determines a matching point Y0 where the third total illuminance IFR is equal to the fourth total illuminance IRR.

Figure 11:
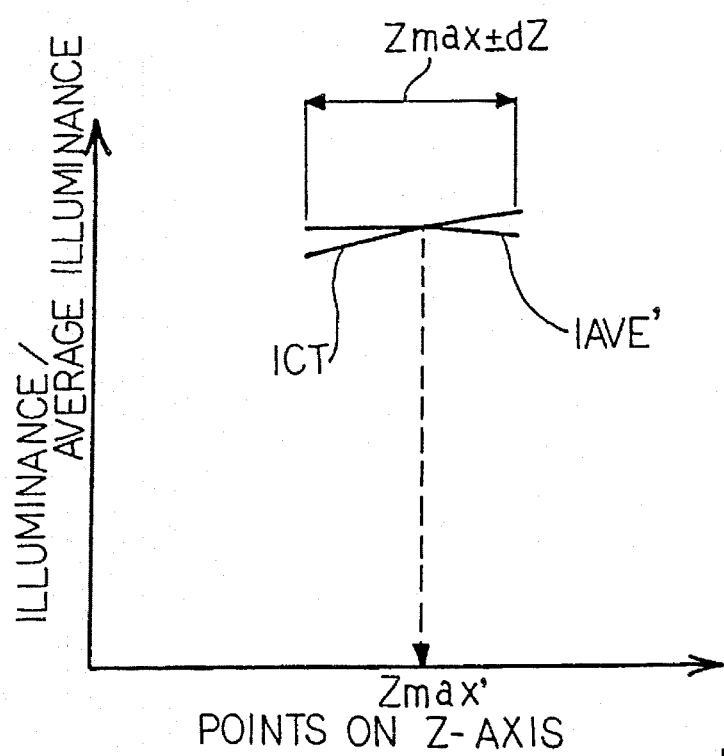
FIG. 11 is a graph showing the illuminance at the center point and an average illuminance in the peripheral sub-area.

Finally, the microprocessor instructs the driving system 37 to stepwise move the ultra high-pressure mercury lamp 31*a* in the vicinity of the maximum point Zmax for enhancing the uniformity of illuminance in the exposure area. The illuminance is measured at every point on the z-axis, and the photo-sensing system 38 supplies the photo-detecting signals S1 to the microprocessor. While the ultra high-pressure mercury lamp 31*a* is being moved along the z-axis, the driving system 37 does not move the ultra high-pressure mercury lamp 31*a* in the direction of x-axis and in the direction of y-axis. The microprocessor calculates an average illuminance IAVE' of the photo-sensors 38*a* to 38*d*, and the average illuminance IAVE' and the illuminance ICT of the photo-sensor ICT are plotted as shown in FIG. 11. The microprocessor compares the average illuminance IAVE' with the illuminance ICT at every point, and determines an optimum point Zmax' where the difference between the average illuminance IAVE' and the illuminance ICT is minimized.

If the difference between the average illuminance IAVE' and the illuminance ICT at the center point falls within the admitted range, the driving system 37 moves the ultra high-pressure mercury lamp 31*a* to the point (X0, Y0, zmax'). On the other hand, if the difference is out of the admitted range, the above described correction is repeated in the vicinity of the point (X0, Y0, Zmax').

As will be understood from the foregoing description, the photo-sensing system 38 monitors not only the four corners of the exposure area 43 but also the center of the exposure area, and the computer unit 39 and the driving system 37 seek the optimum point of the ultra high-pressure mercury lamp 31*a* on the basis of the pieces of illuminance data. As a result, uniformity of the illuminance in the exposure area 43 is enhanced, and the projection aligner according to the present invention exactly adjusts the light source in short time period.

In this instance, the five photo-sensors 38*a* to 38*e* are provided for the exposure area 43. However, if the photo-sensors are increased to nine, by way of example, the uniformity of illuminance is further enhanced.

Second Embodiment

Figure 12:
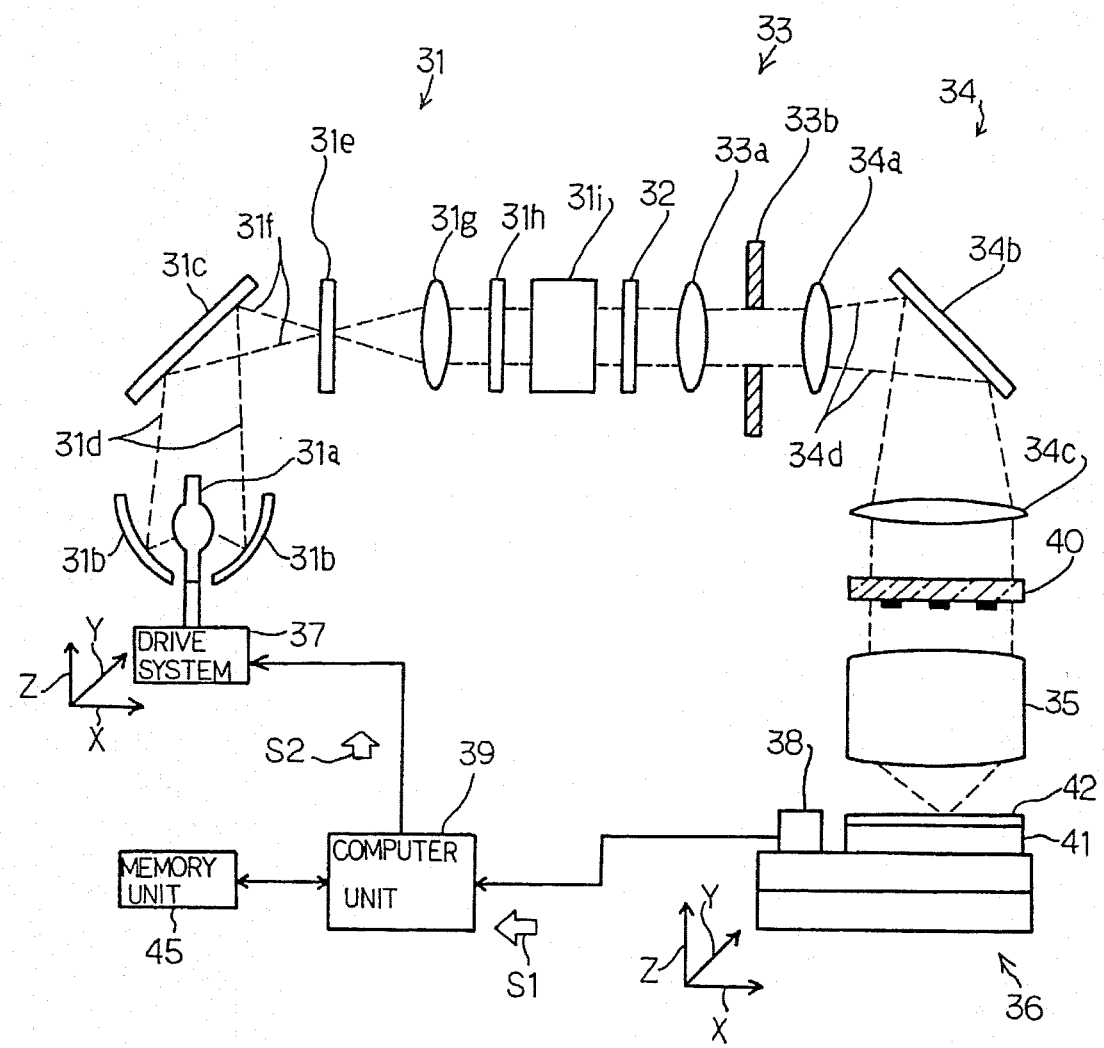
FIG. 12 is a block diagram showing the arrangement of another projection aligner according to the present invention.

Turning to FIG. 12 of the drawings, another projection aligner embodying the present invention is equipped with a memory unit 45. The other component units of the second embodiment are similar to those of the first embodiment, and are labeled with same references as those of the first embodiment without detailed description.

The memory unit is implemented by an electrical, magnetic or opto-magnetic data storage, and a hard disk unit, a magnetic tape/disk unit or an opto-magnetic disk unit is available.

When the diaphragm 32 is replaced with a new diaphragm, the photo-sensing system 38, the computer unit 39 and the driving system 37 cooperate and determine an optimum position of the ultra high-pressure mercury lamp 31*a*. The optimum position is memorized in the memory unit 45 together with the new diaphragm 32. If the diaphragm 32 is replaced with yet another diaphragm, the optimum position for the yet another diaphragm is also memorized in the memory unit 45. Thus, the optimum positions are stored in the memory unit 45 for the respective diaphragms 32.

When one of the diaphragms 32 is used again, the computer unit 39 reads out the optimum position for the diaphragm 32, and instructs the driving system 37 to adjust the ultra high pressure mercury lamp 31*a* to the optimum position without the regulating work described in conjunction with the first embodiment. Even if the optimum position does not make the ultra high pressure mercury lamp 31*a* to uniformly illuminate the exposure area 43, the correction work is carried out in the vicinity of the optimum point, and the computer unit 39 quickly finds the optimum position.

The reason why the optimum point is sometimes deviated from the previous optimum point is that the ultra high-pressure mercury lamp 31*a* does not generate the arc at a certain position at all times. Another reason for the deviation is a change of the ultra high-pressure mercury lamp to a new one. In order to decrease the influence of the ultra high-pressure mercury lamp 31*a*, it is desirable to store differences from the standard diaphragm 8' for the diaphragm 8"

with the ring-shaped opening 8b. In detail, the optimum position for the standard diaphragm 8' is assumed to be (Xc, Yc, Zc). The diaphragm 8" is optimized at the point (x, Xb, Xc) under illumination of the same ultra high-pressure mercury lamp 31a, and the computer unit 39 stores the differences (Xa–Xc, Ya–Yc, Za–Zc) in the memory unit 45. The differences are available insofar as the ultra high-pressure mercury lamp 31a illuminates the diaphragm 8". If the ultra high-pressure lamp 31a is changed to a new one, the optimum position (Xc' Yc' Zc') is determined for the standard diaphragm 8'. Even though the standard point is changed to the (Xc' Yc' Zc'), the differences (Xa–Xc, Ya–Yc, Za–Zc) are available for the diaphragm 8".

The ultra high-pressure mercury lamp is usually changed to a new one after five hundreds hours, and the differences effectively shorten the optimization of the ultra high-pressure mercury lamp.

Although particular embodiments of the present invention have been shown and described, it will be obvious to those skilled in the art that various changes and modifications may be made without departing from the spirit and scope of the present invention.

What is claimed is:

1. A projection aligner for transferring a pattern image of a reticle to an image-forming plane, comprising:

an illuminating system for radiating light from a light source to said reticle so that said reticle transfers the light carrying said pattern image to said photo-sensing layer;

an illuminance measuring system having a plurality of sampling points on said image-forming plane for concurrently generating pieces of illuminance data each indicative of an illuminance of one of said sampling points, and a plurality of photo-sensors respectively associated with said plurality of sampling points and each operative to measure said illuminance of the associated sampling point, one of said plurality of sampling points being provided at a center of said image-forming plane, the others of said plurality of sampling points being provided in a peripheral sub-area of said image-forming plane; and a regulating system responsive to said pieces of illuminance data for changing a position of said light source, thereby causing values of said pieces of illuminance data to fall within an admitted range.

2. The projection aligner as set forth in claim 1, in which said others of said plurality of sampling points are provided at four corners of said peripheral sub-area.

3. A projection aligner for transferring a pattern image of a reticle to a photo-sensing layer on a semiconductor wafer, comprising:

a coherent light generating system having a light source for radiating light toward a first direction, and generating a coherent light from said light radiated from said light source;

a diaphragm having an opening shaped into a predetermined configuration so as to cause said coherent light to be obliquely incident into said reticle;

a masking system provided between said diaphragm and said reticle;

a projection lens unit provided between said reticle and said photo-sensing layer for forming said pattern image carried on said coherent light onto a plane substantially coplanar with said photo-sensing layer;

a movable stage mounting said semiconductor wafer laminated by said photo-sensing layer, and moving said photo-sensing layer into or out of an exposure area of said coherent light carrying said pattern image;

a photo-sensing system having a plurality of illuminance sensors moved into and out of said exposure area by said movable stage for producing luminance signals each indicative of a luminance measured by one of said illuminance sensors, one of said plurality of illuminance sensors being moved to a center of said exposure area for measuring a center illuminance, the others of said plurality of illuminance sensors being moved to a peripheral sub-area of said exposure area;

a computer unit supplied with said luminance signals, and operative to calculate a deviation of said illuminance from an admitted range for generating a driving signal; and a driving system associated with said light source, and responsive to said driving signal for three-dimensionally moving said light source, thereby causing said deviation to fall within said admitted range.

4. The projection aligner as set forth in claim 3, in which said others of said plurality of illuminance sensors selectively form a first group for measuring a first illuminance on a left side of said peripheral sub-area, a second group for measuring a second illuminance on a right side of said peripheral sub-area, a third group for measuring a third illuminance on a front side of said peripheral sub-area and a fourth group for measuring a fourth illuminance on a rear side of said peripheral sub-area.

5. The projection aligner as set forth in claim 4, in which said computer unit cooperates with said photo-sensing system and said driving system for determining a maximum point where an average illuminance of said first to fourth illuminances and said center illuminance is maximized in said first direction, said computer unit further cooperating with said photo-sensing system and said driving system for determining a first matching point in a second direction perpendicular to said first direction where a first total of said first and second illuminances is matched with a second total of said third and fourth illuminances, said computer unit further cooperating with said photo-sensing system and said driving system for determining a second matching point in a third direction perpendicular to said first and second directions where a third total of said first and third illuminances is matched with a fourth total of said second and fourth illuminances, said computer unit further cooperating with said photo-sensing system and said driving system for correcting said maximum in said first direction.

6. A projection aligner for transferring a pattern image of a reticle to a photo-sensing layer on a semiconductor wafer, comprising:

a coherent light generating system having a light source for radiating a light toward a first direction, and generating a coherent light from said light radiated from said light source;

a diaphragm having an opening shaped into a predetermined configuration so as to cause said coherent light to be obliquely incident into said reticle;

a masking system provided between said diaphragm and said reticle;

a projection lens unit provided between said reticle and said photo-sensing layer for forming said pattern image carried on said coherent light onto a plane substantially coplanar with said photo-sensing layer;

a movable stage mounting said semiconductor wafer laminated by said photo-sensing layer, and moving said photo-sensing layer into or out of an exposure area of said coherent light carrying said pattern image;

a photo-sensing system having a plurality of illuminance sensors moved into and out of said exposure area by said movable stage for producing luminance signals each indicative of a luminance measured by one of said illuminance sensors;

a computer unit supplied with said luminance signals, and operative to calculate a deviation of said illuminance from an admitted range for generating a driving signal;

a driving system associated with said light source, and responsive to said driving signal for three-dimensionally moving said light source, thereby causing said deviation to fall within said admitted range; and a memory unit for storing pieces of position data respectively indicative of optimum positions of the light source for a plurality of different models of said diaphragm in said predetermined configuration.

7. The projection aligner as set forth in claim 6, in which one of said plurality of illuminance sensors is moved to a center of said exposure area for measuring a center illuminance, and the others of said plurality of illuminance sensors are moved to a peripheral sub-area of said exposure area, said others of said plurality of illuminance sensors selectively forming a first group for measuring a first illuminance on a left side of said peripheral sub-area, a second group for measuring a second illuminance on a right side of said peripheral sub-area, a third group for measuring a third illuminance on a front side of said peripheral sub-area and a fourth group for measuring a fourth illuminance on a rear side of said peripheral sub-area, said computer unit cooperating with said photo-sensing system and said driving system for determining a maximum point where an average illuminance of said first to fourth illuminances and said center illuminance is maximized in said first direction, said computer unit further cooperating with said photo-sensing system and said driving system for determining a first matching point in a second direction perpendicular to said first direction where a first total of said first and second illuminances is matched with a second total of said third and fourth illuminances, said computer unit further cooperating with said photo-sensing system and said driving system for determining a second matching point in a third direction perpendicular to said first and second directions where a third total of said first and third illuminances is matched with a fourth total of said second and fourth illuminances, said computer unit further cooperating with said photo-sensing system and said driving system for correcting said maximum in said first direction for determining the optimum position for one of said models.

8. The projection aligner as set forth in claim 6, in which another of said models serves as a standard diaphragm, and said pieces of position data are stored as deviations of said optimum positions from the optimum position of said standard diaphragm.

* * * * *